United States Patent
Ohira et al.

(10) Patent No.: US 12,169,316 B2
(45) Date of Patent: Dec. 17, 2024

(54) SEMICONDUCTOR DEVICE INCLUDING LEAF SPRINGS FOR HOLDING OPTICAL FIBER

(71) Applicant: KABUSHIKI KAISHA TOSHIBA, Tokyo (JP)

(72) Inventors: Kazuya Ohira, Nerima (JP); Hideto Furuyama, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 160 days.

(21) Appl. No.: 17/820,934

(22) Filed: Aug. 19, 2022

(65) Prior Publication Data

US 2023/0288652 A1    Sep. 14, 2023

(30) Foreign Application Priority Data

Mar. 10, 2022    (JP) .................................. 2022-036873

(51) Int. Cl.
*G02B 6/42*    (2006.01)
*H01L 25/16*    (2023.01)

(52) U.S. Cl.
CPC ......... *G02B 6/4292* (2013.01); *G02B 6/4206* (2013.01); *G02B 6/424* (2013.01); *H01L 25/167* (2013.01)

(58) Field of Classification Search
CPC ....... G02B 6/42; G02B 6/4202; G02B 6/4292
See application file for complete search history.

(56) References Cited

U.S. PATENT DOCUMENTS

| | | | | |
|---|---|---|---|---|
| 4,274,708 A | * | 6/1981 | Cocito ................. | G02B 6/3806 385/71 |
| 4,311,359 A | * | 1/1982 | Keller .................. | G02B 6/4292 250/227.24 |
| 4,432,602 A | * | 2/1984 | Margolin ............. | G02B 6/3855 385/76 |
| 4,461,537 A | * | 7/1984 | Raymer, II .......... | G02B 6/3897 385/94 |

(Continued)

FOREIGN PATENT DOCUMENTS

EP        1152271 A2  *  11/2011
JP     H01-229209 A       9/1989

(Continued)

OTHER PUBLICATIONS

Office Action Issued Aug. 28, 2024 in Japanese Patent Application No. 2022-036873, with concise English translation, citing documents 15-19 therein.

*Primary Examiner* — Michael Stahl
(74) *Attorney, Agent, or Firm* — Oblon, McClelland, Maier & Neustadt, L.L.P.

(57) ABSTRACT

A semiconductor device includes a substrate; a holding member located on the substrate, the holding member including an optical fiber holding part and a module placement part arranged in a first direction; an optical module located in the module placement part and mounted on the substrate; an optical fiber passing through the optical fiber holding part, the optical fiber being connected with the optical module; and a first leaf spring and a second leaf spring located in the optical fiber holding part, the first leaf spring and the second leaf spring holding the optical fiber between the first leaf spring and the second leaf spring in a direction crossing the first direction.

13 Claims, 3 Drawing Sheets

(56) References Cited

U.S. PATENT DOCUMENTS

| | | | | |
|---|---|---|---|---|
| 4,533,209 A * | 8/1985 | Segerson | ............ | G02B 6/4292 |
| | | | | 257/433 |
| 4,838,641 A * | 6/1989 | Morimoto | ............ | G02B 6/4292 |
| | | | | 385/87 |
| 6,431,763 B1 * | 8/2002 | Sherman | ............ | G02B 6/3888 |
| | | | | 385/62 |
| 2013/0183011 A1 * | 7/2013 | Weberpals | ........... | G02B 6/4292 |
| | | | | 385/94 |

FOREIGN PATENT DOCUMENTS

| | | |
|---|---|---|
| JP | 2000-321466 A | 11/2000 |
| JP | 2017-167261 A | 9/2017 |
| JP | 2020-181045 A | 11/2020 |
| WO | WO 2020/245865 A1 | 12/2020 |
| WO | WO 2021/165721 A1 | 8/2021 |

* cited by examiner

SEMICONDUCTOR DEVICE INCLUDING LEAF SPRINGS FOR HOLDING OPTICAL FIBER

CROSS-REFERENCE TO RELATED APPLICATION

This application is based upon and claims the benefit of priority from Japanese Patent Application No. 2022-036873, filed on Mar. 10, 2022; the entire contents of which are incorporated herein by reference.

FIELD

Embodiments described herein relate generally to a semiconductor device.

BACKGROUND

An optical fiber is fixed with respect to an optical module by, for example, an adhesive or the like.

DETAILED DESCRIPTION

Figure 1:
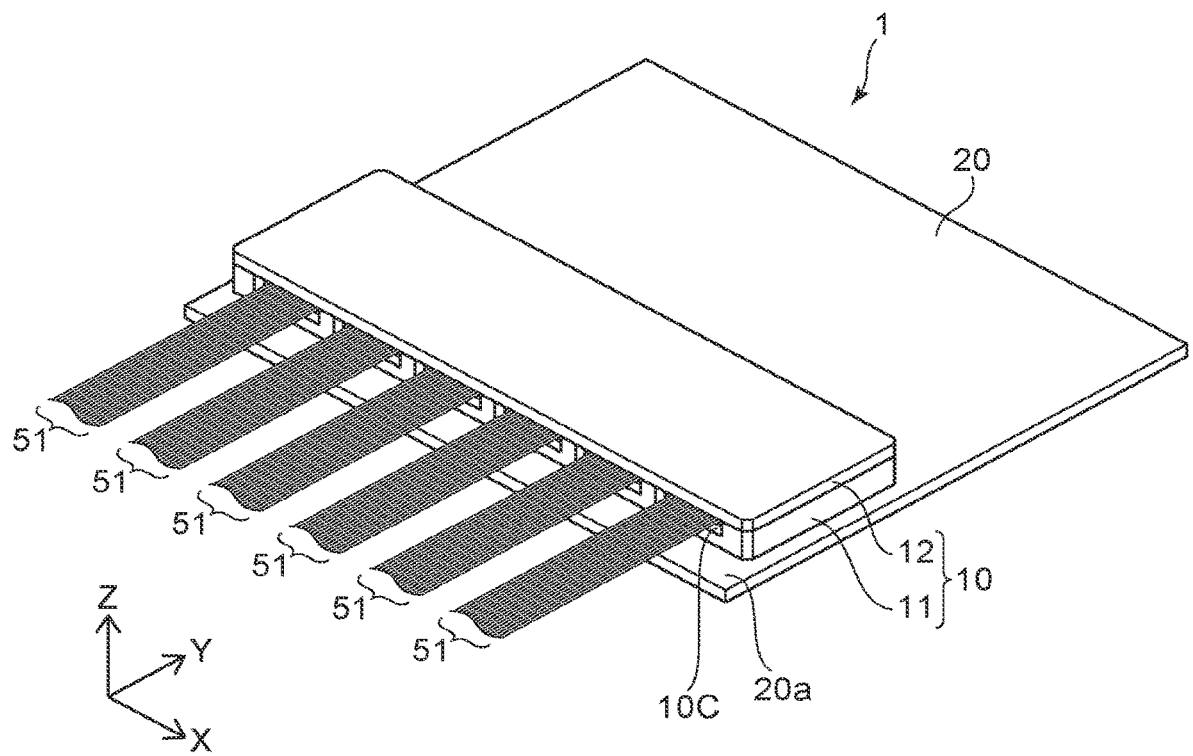
FIG. 1 is a schematic perspective view of a semiconductor device of an embodiment.

According to one embodiment, a semiconductor device includes a substrate; a holding member located on the substrate, the holding member including an optical fiber holding part and a module placement part arranged in a first direction; an optical module located in the module placement part and mounted on the substrate; an optical fiber passing through the optical fiber holding part, the optical fiber being connected with the optical module; and a first leaf spring and a second leaf spring located in the optical fiber holding part, the first leaf spring and the second leaf spring holding the optical fiber between the first leaf spring and the second leaf spring in a direction crossing the first direction.

Embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

The same or similar components are marked with the same reference numerals.

Figure 2:
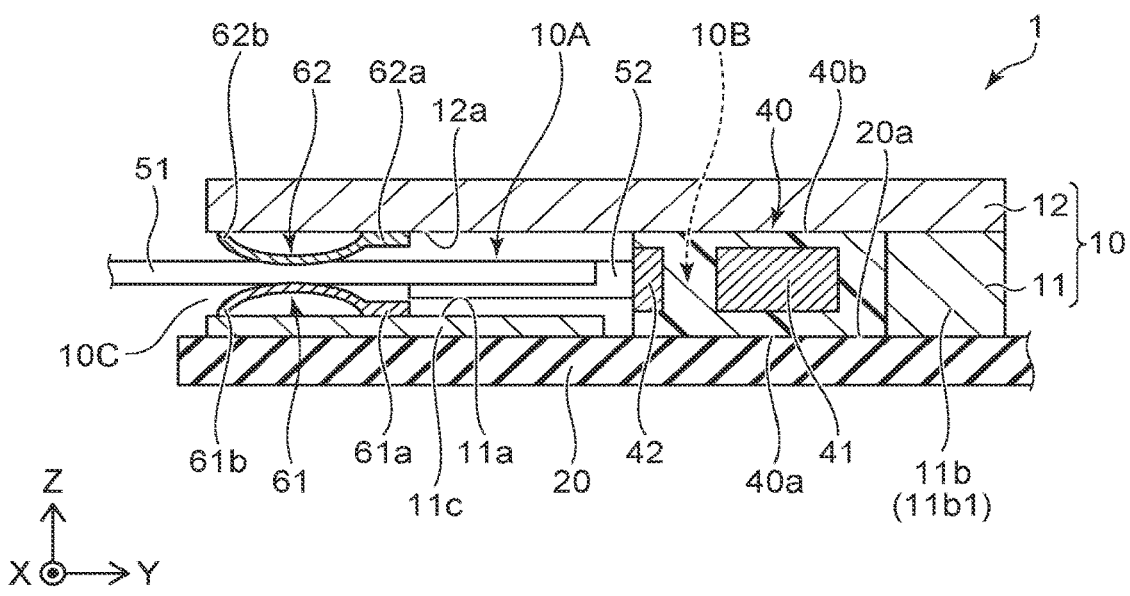
FIG. 2 is a schematic cross-sectional view of the semiconductor device of the embodiment.

As shown in FIGS. 1 and 2, a semiconductor device 1 of the embodiment includes a substrate 20, a holding member 10, an optical module 40, an optical fiber 51, a first leaf spring 61, and a second leaf spring 62.

The holding member 10 and the optical module 40 are located on a mounting surface 20a of the substrate 20. The substrate 20 is made of an insulative material. For example, a resin or ceramic can be used as the material of the substrate 20. Two directions that cross, e.g., are orthogonal to, each other in a plane parallel to the mounting surface 20a of the substrate 20 are taken as a first direction Y and a second direction X. A direction that crosses, e.g., is orthogonal to, the first direction Y and the second direction X is taken as a vertical direction Z. "Up" refers to the side at which the mounting surface 20a is located with respect to the substrate 20 in the vertical direction Z, or the direction in which the holding member 10 is located when referenced to the substrate 20. "Down" refers to the direction opposite to "up" in the vertical direction Z. The upper or lower surface of a component refers to the surface of the component at the upper side or the lower side. A side surface of the component refers to a surface of the component that includes the Z-direction.

The holding member 10 includes an optical fiber holding part 10A and a module placement part 10B arranged in the first direction Y. Multiple optical fiber holding parts 10A are arranged in the second direction X; and multiple module placement parts 10B are arranged in the second direction X. The holding member 10 also includes a first holding part 11 and a second holding part 12. For example, the optical fiber holding part 10A and the module placement part 10B are formed as a space that is open upward in the first holding part 11. The second holding part 12 has a shape that extends in the first and second directions Y and X and covers the optical fiber holding part 10A and the module placement part 10B from above.

Figure 3:
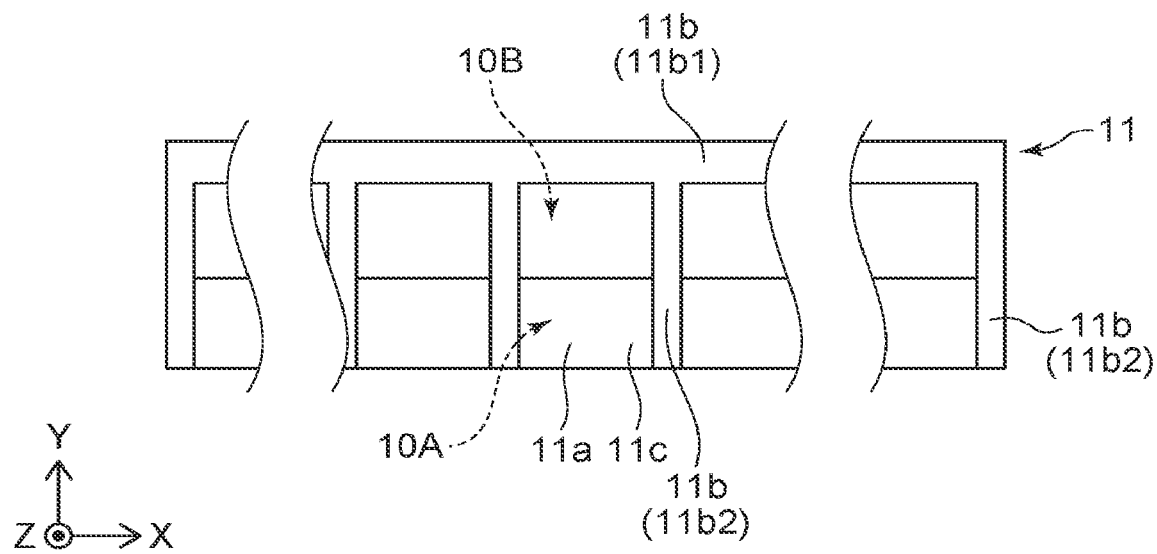
FIG. 3 is a schematic plan view of a first holding part of the embodiment.

FIG. 3 is a schematic plan view of the first holding part 11. The first leaf spring 61 is not illustrated in FIG. 3. The first holding part 11 includes a first thickness part 11b and a second thickness part 11c, and is fixed to the mounting surface 20a of the substrate 20. The first thickness part 11b has a first thickness in the vertical direction Z. The first thickness part 11b contacts the substrate 20 and has, for example, a comb-shaped configuration including a component 11b1 extending in the second direction X and components 11b2 extending in the first direction Y. The second holding part 12 is supported on the first thickness part 11b at a prescribed spacing from the substrate 20. The optical fiber holding part 10A and the module placement part 10B are positioned to be spatially connected in the second direction X.

The second thickness part 11c is positioned at an opening 10C side of the first holding part 11 in the first direction Y, is positioned between the components 11b2 of the first thickness part 11b in the second direction X, and has a shape that extends in the first and second directions Y and X. A second thickness of the second thickness part 11c in the vertical direction Z is less than the first thickness. The second thickness part 11c contacts the substrate 20; and the upper surface of the second thickness part 11c is a bottom surface 11a of the optical fiber holding part 10A.

The optical fiber holding part 10A is positioned between the second thickness part 11c and the second holding part 12 in the vertical direction Z. The module placement part 10B is formed as a through-part extending through the first holding part 11 in the vertical direction Z, is positioned between the second thickness part 11c and the component 11b1 of the first thickness part 11b in the first direction Y, and is positioned between the components 11b2 of the first thickness part 11b in the second direction X. Although an example is shown in FIG. 3 in which the multiple optical fiber holding parts 10A are arranged in the second direction X and the multiple module placement parts 10B are arranged in the second direction X, there may be one optical fiber holding part 10A and one module placement part 10B. The first holding part 11 and the second holding part 12 may be formed to have a continuous body.

The optical module 40 is located in the module placement part 10B and is mounted on the mounting surface 20a of the substrate 20. The module placement part 10B aligns the position of the optical module 40 on the mounting surface 20a of the substrate 20.

The optical module 40 includes an optical element 42 that is optically coupled with the optical fiber 51, and a semiconductor element 41 that is electrically connected with the optical element 42. The optical element 42 is a light-receiving element that converts an optical signal from the optical fiber 51 into an electrical signal and transmits the electrical signal to the semiconductor element 41. Or, the optical element 42 is a light-emitting element that converts an electrical signal from the semiconductor element 41 into an optical signal and transmits the optical signal to the optical fiber 51. The semiconductor element 41 is, for example, an IC (Integrated Circuit) chip.

The opening 10C that communicates with the optical fiber holding part 10A is formed in the end part in the first direction Y of the holding member 10. In the first direction Y, the optical fiber holding part 10A is positioned between the opening 10C and the optical module 40. The optical fiber 51 extends in the first direction Y, passes through the opening 10C and the optical fiber holding part 10A, and is connected with the optical module 40. For example, the optical fiber 51 is connected to the optical module 40 by an adhesive. The optical fiber 51 may be directly connected with the optical module 40, or may be connected with the optical module 40 by providing a lens 52 at the vicinity of the optical module 40. For example, the lens 52 is made of glass or a resin. As shown in FIG. 1, for example, multiple optical fibers 51 that are arranged in the second direction X can be connected to the optical module 40.

Multiple mounting pads are located at the mounting surface 20a of the substrate 20. The optical module 40 includes a terminal placement surface 40a facing the mounting surface 20a of the substrate 20. Multiple terminals that are electrically connected with at least the semiconductor element 41 are located at the terminal placement surface 40a.

The optical module 40 is pressed onto the mounting surface 20a of the substrate 20 by the lower surface of the second holding part 12 pressing on an upper surface 40b of the optical module 40. The electrical connection between the terminals located at the terminal placement surface 40a of the optical module 40 and the mounting pads located at the mounting surface 20a of the substrate 20 are ensured thereby. The terminals and the mounting pads may be in direct contact or may be electrically connected via an anisotropic conductive member. The optical module 40 can be detached from the module placement part 10B and replaced by detaching the second holding part 12 from the first holding part 11.

The first leaf spring 61 and the second leaf spring 62 are located in the optical fiber holding part 10A of the holding member 10. In the optical fiber holding part 10A, the bottom surface 11a of the first holding part 11 and a lower surface 12a of the second holding part 12 face each other in the vertical direction Z. The first leaf spring 61 is located at the bottom surface 11a of the first holding part 11; and the second leaf spring 62 is located at the lower surface 12a of the second holding part 12.

The first leaf spring 61 includes a first end part 61a and a second end part 61b. The first end part 61a is positioned more proximate to the connection part with the optical module 40 in the first direction Y than the second end part 61b; and the second end part 61b is positioned more distant to the connection part with the optical module 40 in the first direction Y than the first end part 61a. One of the first end part 61a or the second end part 61b is fixed to the holding member 10. For example, the first end part 61a is fixed to the bottom surface 11a of the first holding part 11. The second end part 61b is not fixed to the holding member 10 and can move in the first direction Y in contact with the bottom surface 11a of the first holding part 11 due to elastic deformation of the first leaf spring 61. The part of the first leaf spring 61 between the first end part 61a and the second end part 61b is curved to be convex upward.

The second leaf spring 62 includes a first end part 62a and a second end part 62b. The first end part 62a is positioned more proximate to the connection part with the optical module 40 in the first direction Y than the second end part 62b; and the second end part 62b is positioned more distant to the connection part with the optical module 40 in the first direction Y than the first end part 62a. One of the first end part 62a or the second end part 62b is fixed to the holding member 10. For example, the first end part 62a is fixed to the lower surface 12a of the second holding part 12. The second end part 62b is not fixed to the holding member 10 and can move in the first direction Y in contact with the lower surface 12a of the second holding part 12 due to elastic deformation of the second leaf spring 62. The part of the second leaf spring 62 between the first end part 62a and the second end part 62b is curved to be convex downward.

The first leaf spring 61 and the second leaf spring 62 hold the optical fiber 51 between the first leaf spring 61 and the second leaf spring 62 in the vertical direction Z. For example, the optical fiber 51 is sandwiched between the curved part of the first leaf spring 61 and the curved part of the second leaf spring 62. The first leaf spring 61 presses the optical fiber 51 upward in the vertical direction Z; and the second leaf spring 62 presses the optical fiber 51 downward in the vertical direction Z. It is desirable for the position in the first direction Y of the contact between the first leaf spring 61 and the optical fiber 51 and the position in the first direction Y of the contact between the second leaf spring 62 and the optical fiber 51 to be the same. Thereby, the holding height (the position in the vertical direction Z) of the optical fiber 51 can be regulated in the optical fiber holding part 10A of the holding member 10. For example, the optical fiber 51 is horizontally held in the optical fiber holding part 10A at the vicinity of the connection part with the optical module 40; and stress on the connection part with the optical module 40 can be reduced. Thereby, the optical fiber 51 can be prevented from breaking or detaching from the optical module 40.

The elastic deformation of the first and second leaf springs 61 and 62 allows some movement of the optical fiber 51 in the vertical direction Z, so that an excessive force is not easily applied to the optical fiber 51. The part of the optical fiber 51 at the lens 52 or the connection part with the optical module 40 has low flexibility and does not easily move vertically. It is therefore favorable for the optical fiber 51 to be held between the first leaf spring 61 and the second leaf spring 62 at a position more proximate to the opening 10C in the first direction Y than the part of the optical fiber 51 at the lens 52 or the connection part with the optical module 40. It is favorable for the part of the optical fiber 51 sandwiched between the first leaf spring 61 and the second leaf spring 62 to be several mm away from the lens 52 or the connection part with the optical module 40 in the first direction Y.

For each of the first and second leaf springs 61 and 62, both of the end parts are not fixed to the holding member 10; therefore, the range of movement of the elastic deformation of the first and second leaf springs 61 and 62 is greater, and the optical fiber 51 does not easily break when a large movement in the vertical direction Z occurs. By supporting the first leaf spring 61 and the second leaf spring 62 as cantilevers as shown in FIG. 4, the range of movement of the first and second leaf springs 61 and 62 can be greater, and the optical fiber 51 is less likely to break.

Figure 4:
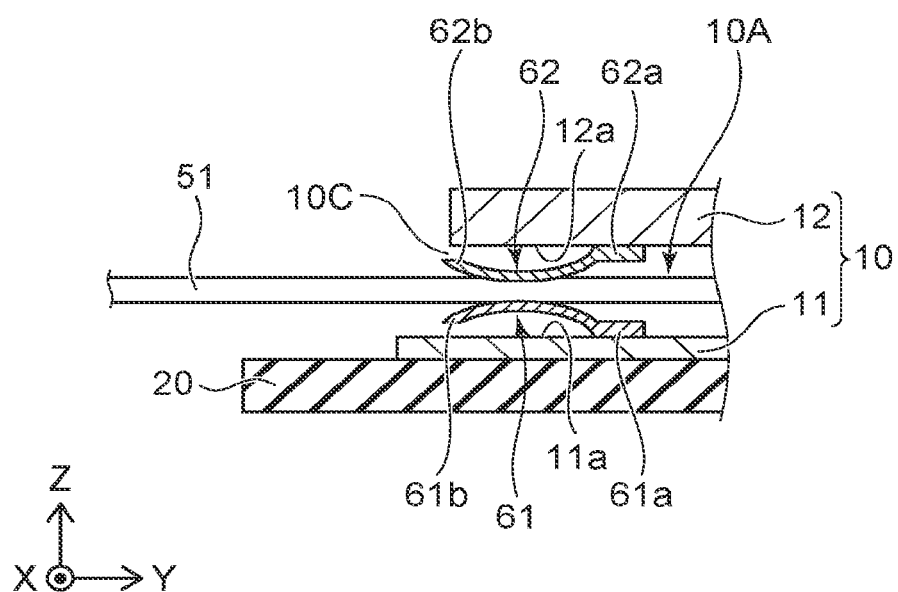
FIG. 4 is a schematic cross-sectional view of another example of a leaf spring of the embodiment.

In the example shown in FIG. 4, the first end part 61a of the first leaf spring 61 and the first end part 62a of the second leaf spring 62 are fixed to the holding member 10. The second end part 61b of the first leaf spring 61 and the second end part 62b of the second leaf spring 62 do not contact the holding member 10. The second end part 61b of the first leaf spring 61 is separated from the bottom surface 11a of the first holding part 11; and the second end part 62b of the second leaf spring 62 is separated from the lower surface 12a of the second holding part 12. A part of the first leaf spring 61 and a part of the second leaf spring 62 may be positioned outside the optical fiber holding part 10A or outside the opening 10C.

Contrary to the examples of FIGS. 2 and 4, the second end part 61b of the first leaf spring 61 and the second end part 62b of the second leaf spring 62 may be fixed to the holding member 10 so that the first end part 61a of the first leaf spring 61 and the first end part 62a of the second leaf spring 62 do not contact the holding member 10.

By allowing the second end parts 61b and 62b that are separated from the connection part with the optical module 40 to freely move instead of the first end parts 61a and 62a as shown in FIGS. 2 and 4, it is easier to increase the range of movement in the vertical direction Z of the first and second leaf springs 61 and 62, and an excessive force is not easily applied to the optical fiber 51.

Figure 5:
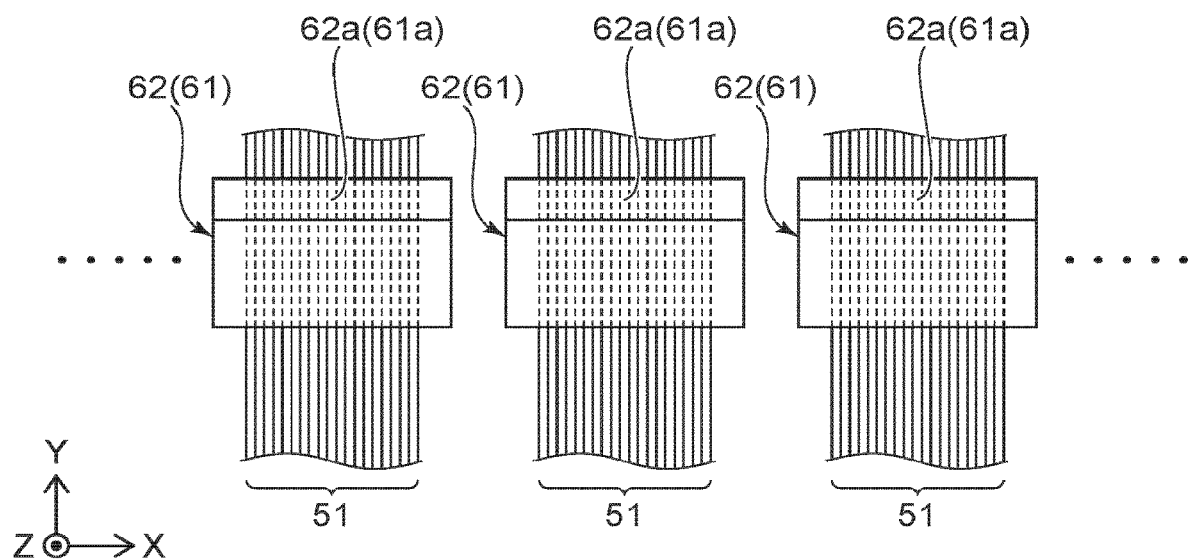
FIG. 5 is a schematic plan view of a leaf spring of the embodiment.

At least one optical fiber 51 can be held in the vertical direction Z between one set of the first and second leaf springs 61 and 62 facing each other in the vertical direction Z. As shown in FIG. 5, multiple optical fibers 51 that are arranged in the second direction X can be held in the vertical direction Z between one set of the first and second leaf springs 61 and 62. Although FIG. 5 shows an example in which two optical fibers 51 are held in the vertical direction Z between one set of the first and second leaf springs 61 and 62, one set of the first and second leaf springs 61 and 62 may collectively hold three or more optical fibers 51. The optical fiber 51 may be a ribbon fiber bundle of multiple optical fibers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a substrate;
a holding member located on the substrate, the holding member including an optical fiber holding part and a module placement part arranged in a first direction;
an optical module located in the module placement part and mounted on the substrate;
an optical fiber passing through the optical fiber holding part, the optical fiber being connected with the optical module; and
a first leaf spring and a second leaf spring located in the optical fiber holding part, the first leaf spring and the second leaf spring holding the optical fiber between the first leaf spring and the second leaf spring in a direction crossing the first direction, wherein
the optical module includes:
an optical element optically coupled with the optical fiber; and
a semiconductor element electrically connected with the optical element.

2. A semiconductor device, comprising:
a substrate;
a holding member located on the substrate, the holding member including an optical fiber holding part and a module placement part arranged in a first direction;
an optical module located in the module placement part and mounted on the substrate;
an optical fiber passing through the optical fiber holding part, the optical fiber being connected with the optical module; and
a first leaf spring and a second leaf spring located in the optical fiber holding part, the first leaf spring and the second leaf spring holding the optical fiber between the first leaf spring and the second leaf spring in a direction crossing the first direction, wherein
the first leaf spring and the second leaf spring each include a first end part and a second end part,
the first end part is positioned more proximate to a connection part with the optical module in the first direction than the second end part,
the second end part is positioned more distant to the connection part with the optical module in the first direction than the first end part,
one of the first end part or the second end part is fixed to the holding member,
the other of the first end part or the second end part is movable in the first direction with respect to the holding member,
the first leaf spring and the second leaf spring each include a curved part between the first end part and the second end part, and
the optical fiber is sandwiched between the curved parts of the first and second leaf springs.

3. The device according to claim 2, wherein
the first end part is fixed to the holding member.

4. A semiconductor device, comprising:
a substrate;
a holding member located on the substrate, the holding member including an optical fiber holding part and a module placement part arranged in a first direction;
an optical module located in the module placement part and mounted on the substrate;
an optical fiber passing through the optical fiber holding part, the optical fiber being connected with the optical module; and
a first leaf spring and a second leaf spring located in the optical fiber holding part, the first leaf spring and the second leaf spring holding the optical fiber between the first leaf spring and the second leaf spring in a direction crossing the first direction, wherein the first leaf spring and the second leaf spring each include a first end part and a second end part, the first end part is positioned more proximate to a connection part with the optical module in the first direction than the second end part, the second end part is positioned more distant to the connection part with the optical module in the first direction than the first end part, one of the first end part or the second end part is fixed to the holding member, and the other of the first end part or the second end part does not contact the holding member.

5. The device according to claim 4, wherein the first end part is fixed to the holding member.

6. The device according to claim 1, wherein the first leaf spring and the second leaf spring hold a plurality of optical fibers between the first leaf spring and the second leaf spring in the direction crossing the first direction.

7. The device according to claim 1, wherein the direction crossing the first direction is perpendicular to a surface of the substrate, and the holding member and the optical module are located at the surface of the substrate.

8. The device according to claim 1, wherein the optical element is a light-receiving element that converts an optical signal from the optical fiber into an electrical signal and transmits the electrical signal to the semiconductor element.

9. The device according to claim 1, wherein the optical element is a light-emitting element that converts an electrical signal from the semiconductor element into an optical signal and transmits the optical signal to the optical fiber.

10. The device according to claim 1, wherein an opening that communicates with the optical fiber holding part is formed in an end part in the first direction of the holding member, and the optical fiber extends in the first direction, passes through the opening and the optical fiber holding part, and is connected to the optical module.

11. The device according to claim 1, wherein the optical fiber is connected with the optical module via a lens.

12. The device according to claim 4, wherein the first leaf spring and the second leaf spring each include a curved part between the first end part and the second end part, and the optical fiber is sandwiched between the curved parts of the first and second leaf springs.

13. The device according to claim 1, wherein a position in the first direction at which the first leaf spring and the optical fiber contact is a same as a position in the first direction at which the second leaf spring and the optical fiber contact.

* * * * *